United States Patent [19]

Alles

[11] 4,129,751

[45] Dec. 12, 1978

[54] PCM DATA THROTTLE

[75] Inventor: Harold G. Alles, Bridgewater, N.J.

[73] Assignee: Bell Telephone Laboratories, Incorporated, Murray Hill, N.J.

[21] Appl. No.: 829,010

[22] Filed: Aug. 30, 1977

[51] Int. Cl.² .............................................. H04J 3/18
[52] U.S. Cl. .......................... 179/15 BW; 179/15 AW
[58] Field of Search ...... 179/15 BW, 15 AW, 15 AP, 179/15 AS; 340/347 DD

[56] References Cited

U.S. PATENT DOCUMENTS

| 3,588,364 | 6/1971 | Wallingford | 179/15 BW |
| 3,927,268 | 12/1975 | Sciulli | 179/15 BW |

Primary Examiner—David L. Stewart
Attorney, Agent, or Firm—Charles Scott Phelan; Erwin W. Pfeifle

[57] ABSTRACT

A data throttling arrangement is advantageously incorporated in a pulse width modulated (PWM) to pulse code modulated (PCM) signal converter for controlling the output rate of the PCM data stream. PWM data is converted to PCM data and stored in a memory. New PCM data is received and compared with the stored PCM data. The difference between the stored and the new PCM data is compared to a preselected threshold value. If the difference between the new and stored data is greater than the threshold value, the new PCM data is permitted to output; otherwise, the new data is disregarded as redundant or insignificant. Circuitry is provided to adjust the values of incoming PCM data by comparing it to predetermined zero offset values. Additional circuitry is provided to permit adjustment of the preselected threshold values in response to the rate of the PCM output data stream.

9 Claims, 3 Drawing Figures

PCM DATA THROTTLE

BACKGROUND OF THE INVENTION

1. Field of the Invention

This invention relates to data reduction arrangements of the type which remove redundant or insignificant data from a data stream. More particularly, this invention relates to data reduction schemes which receive information in the form of a pulse code modulated (PCM) data stream at a first rate of input, and provide a PCM data stream at a second, slower rate of output.

2. Description of the Prior Art

The prior art has thrust at data reduction problems with several techniques in an effort to more economically transmit and process data. A first such data reduction technique is denominated "run length encoding" and involves the replacement of redundant units of information with data corresponding to the number of successive redundant events. There are at least two substantial drawbacks associated with run length encoding, not the least of which involves the fact that data which contains only small amounts of redundancy will not benefit from such encoding, and may result in expansion of the data contained in the original data stream. The second drawback relates to the fact that run length encoding is generally applicable to remove redundancies in the data, but not insignificant data. The prior art provides variations of run length encoding to help compensate for some of the above-mentioned shortcomings. For example, in a data stream comprised of zeroes and ones where it is desired to remove redundant ones, circuitry is provided to switch over to an encoding scheme whereby redundant zeroes are removed if they outnumber the ones. Alternatively, the system may switch over to a direct data output line, thereby bypassing the data reduction circuitry.

Another data compaction technique known in the art involves bit by bit comparison of new data with old data and the generation of signals responsive to the differences between the data words which have been removed and the prior data sequences. This type of compaction is especially suited for reducing long data words into shorter words which contain only the differential information. Such a data compaction technique is not directly usable in systems which process data words of invariant length without reconstruction of the long data words. An illustrative examples of a data system which utilizes long data words which may contain only small differences between successive words relates to video image data transmission wherein video frames are reconstructed using the differential data. The complexities associated with this type of data compaction scheme render it cost effective only in long data word applications.

It is therefore an object of this invention to improve data reduction systems which reduce the amounts of redundant and insignificant data in a PCM data stream.

It is a further object of this invention to provide a data reduction system which is advantageously adjusted to provide a substantially constant rate of output data as the input data rate varies.

SUMMARY OF THE INVENTION

A data reduction scheme is disclosed for reducing the amounts of redundant and insignificant data in a PCM data stream. Current PCM data is compared to prior PCM data stored in a memory. The net difference between the current and prior data is compared to a threshold PCM value. If the net difference between the current and prior PCM values exceeds the threshold value, the current PCM value is permitted to output and it is also stored in memory to serve as prior data for subsequent PCM data.

In one embodiment of the invention, the data throttling arrangement operates within the context of a PWM-to-PCM signal converter. Current PWM information is received from plural data sources and converted to gross PCM signal values. The gross current PCM values are stored in a first of four memory areas each containing specifically addressable locations associated with respective ones of the PWM data sources.

In a second memory area are stored PM bias values for each PWM data source. Such bias values are subtracted from the gross current PCM values in the first memory area, by operation of arithmetic circuitry, to generate adjusted current PCM values which more meaningfully correlate with each other and to a common zero value. A third memory area contains adjusted prior PCM values to which are compared the adjusted current PCM values. The absolute difference between the adjusted current PCM values and the adjusted prior PCM values represents the net change in the PCM value. This net change is compared to threshold PCM values stored in a fourth memory area. Only if the net PCM value change exceeds the threshold value is the adjusted current PCM value permitted to output.

In one embodiment of the invention, circuitry is provided to alter the values of all or selective ones of the threshold values stored in the fourth memory area in response to the PCM data output rate. The circuitry permits access to the memory areas by both the arithmetic circuitry described hereinabove and an external computer which processes the output PCM data and performs the actual threshold value adjustment. Although such an external computer is not an element of the invention, one embodiment of the invention serves to interface plural PWM data sources and an LSI-11 computer manufactured by Digital Equipment Corporation.

It is a feature of the invention that the sensitivity of the data throttle is adjustable in response to the rate of the PCM data output. This feature permits the advantageous employment of full sensitivity when the PCM information rate is low, and such sensitivity is reduced as the PCM information rate increases.

It is a feature of one embodiment of this invention that the threshold values are each independently adjustable, thereby permitting the respective data sources to issue output data at predesigned rate, as per the operational requirements of the specific embodiment.

It is another feature of one embodiment of this invention that the data from characteristically different PWM data sources are accommodated and advantageously adjusted for mutual correlation to a common zero reference, and consequently to each other. This feature permits less costly and simpler processing equipment to handle the data stream containing information from plural data sources.

It is a further feature of one embodiment of the invention that the memory areas are accessible to the arithmetic circuitry discussed above and to an external computer which processes the output PCM data stream. Such a plural processor memory access feature permits the information in the memory to be altered by the processing computer and prevents needless duplication of memory hardware.

DETAILED DESCRIPTION

Figure 1:
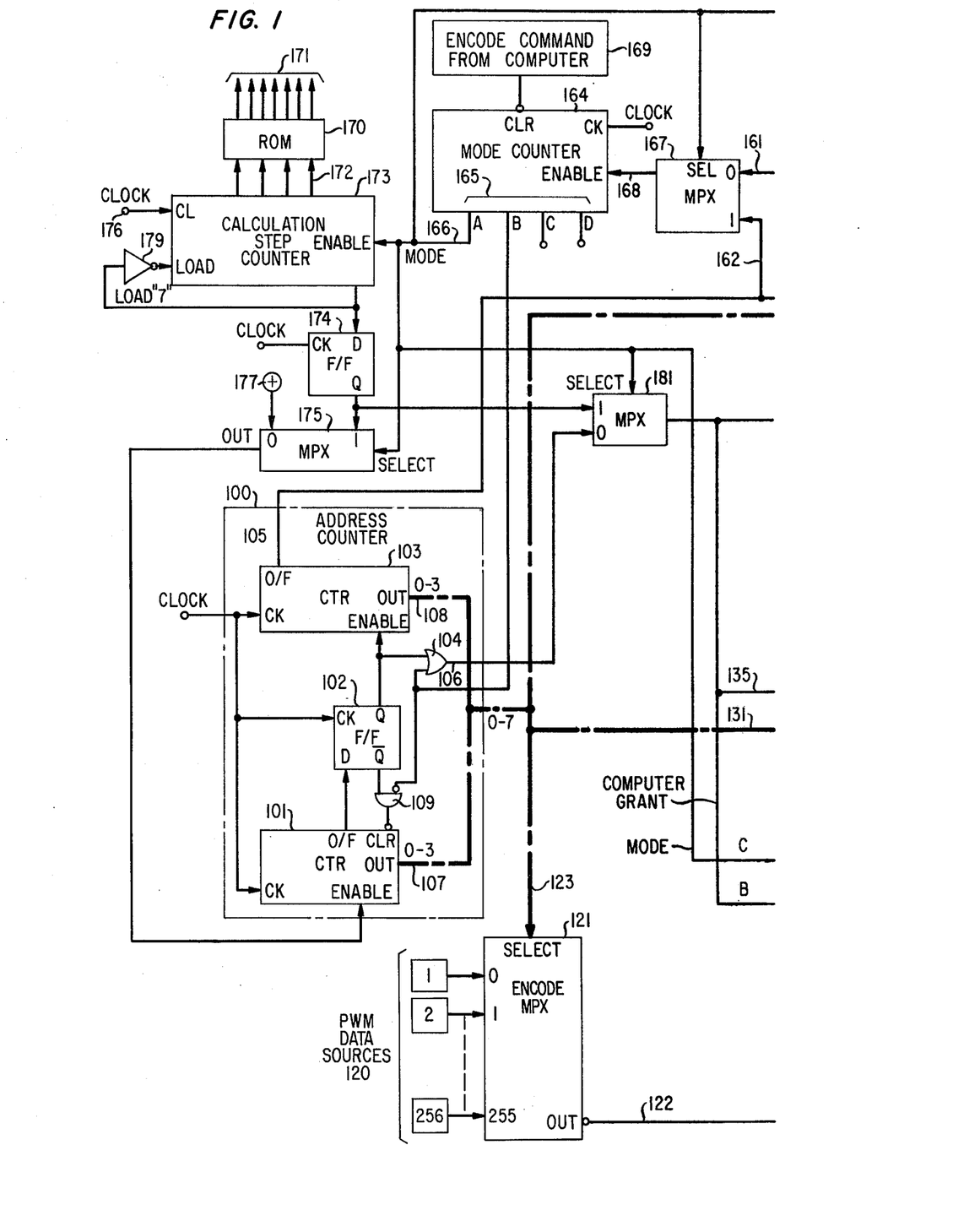
FIGS. 1, 2 and 3 are a block and line representation of a PWM-to-PCM encoder containing logic circuitry for removing redundant or insignificant PCM information from a PCM data stream. The Figures interconnect side-by-side with each other, with FIG. 1 on the left side, FIG. 2 in the center and FIG. 3 on the right side.
Figure 2:
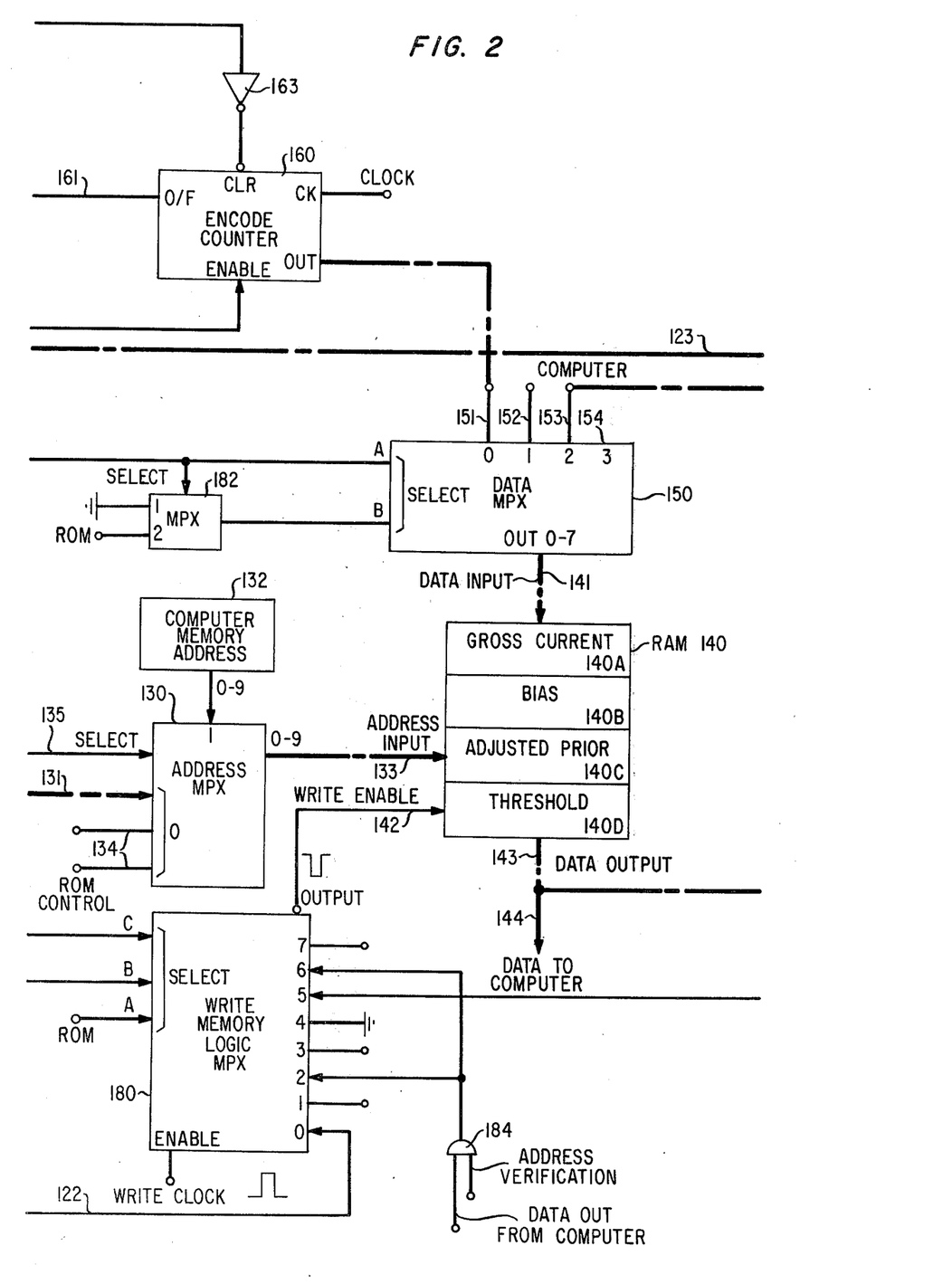
Figure 3:
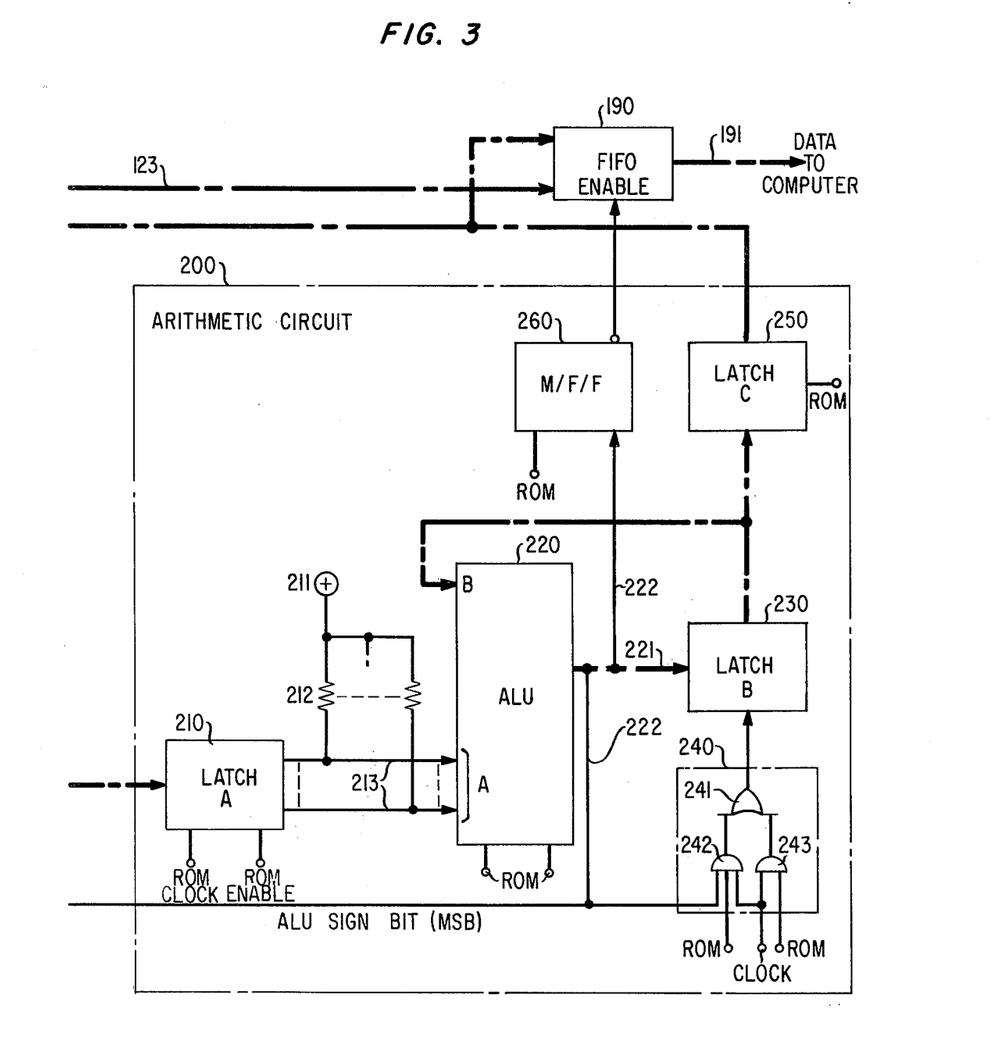

FIGS. 1, 2 and 3 show in block and line representation a system for generating a PCM data stream corresponding to the PWM data from as many as 256 PWM data sources 120 and for reducing the amount of redundant and insignificant information in the PCM data stream. An exemplary PWM data source 120 which is well suited for connection to the system disclosed herein is shown in my copending application entitled "Multidevice Position Digital Encoder" (Ser. No. 798,161; filed May 18, 1977) which relates to the digital encoding of the positions of keys in a musical keyboard. The essential functions of the subject system are to receive PWM data from plural PWM data sources 120, convert the PWM data to PCM data and arithmetically process the PCM data to remove the redundant and insignificant information. An arithmetic logic circuit 200 in FIG. 3 and a random access memory (RAM) 140 in FIG. 2 coact to compare new PCM information with prior PCM information and preselected threshold parameters, stored in RAM 140 in one of four memory areas (140A–140D) each containing an addressable memory location for each of the PWM data sources. New PCM data which differs from prior PCM data by an amount greater than the associated threshold parameter is permitted to output; otherwise, the data is disregarded as redundant or insignificant.

An embodiment of the invention has been constructed to control the rate of PCM information delivered to an LSI-11 computer manufactured by Digital Equipment Corporation. Although the computer is neither an element of the invention, nor is it specifically shown in the drawing, several terminals and connections are shown throughout the depicted system to interface the invention with the computer. The computer not only receives for subsequent processing the output data from the system, but also has access to the system memory 140 during predesigned interruptions in the operation of the system. During such interruptions, the computer can alter the draw data from the memory in accordance with commands from its own program control. Circuitry for effecting the interruptions and memory access to the computer will be described.

Prior to the initial operation of the system, the second and fourth memory areas (140B and 140D) of RAM 140 are loaded with bias values and threshold values, respectively. The bias values in the second memory area result from the PCM encoding of the signals from the PWM data sources while the sources are providing PWM signals which correspond to zero values. For example, in an embodiment of the invention where the PWM data sources provide PWM signals which correspond to the position of keys in a musical keyboard, the bias values represent the gross PCM encoded value of the PWM signals from the PWM data sources while the keyboard keys are all in the normal, rest position. The fourth area is loaded with threshold values which are used by the arithmetic circuit 200 to determine whether new data differs from prior data by an amount sufficient to deem the new data significant enough to permit it to output. This threshold value may be viewed as determining the sensitivity of the encoder.

The subject system functions in successive modes of operation referred to as the encode mode and the calculation mode. The following overview of the modes of operation of the system will be followed by a more detailed description: During the encode mode of operation, each PWM data source 120 is assigned a clock rate time slot by an encode multiplexer 121 in response to the signals on a multiconductor cable 123, shown as a dashed line in FIG. 1, from an address counter 100. The binary signals on the conductors in output cables 107 and 108 in address counter 100 are used to select address locations in RAM 140 and to select respective ones of the PWM data sources connected to encode multiplexer 121. The signals from the address counter identify the specific PWM source whose output signal is being processed, and, as will be discussed below, such address signals will accompany the output data. A detailed description of the circuitry contained in the address counter will also be given below.

During its respective time slot, the inverted output state of the selected PWM data source is delivered to a WRITE ENABLE input 142 of RAM 140 via conductor 122 and a write memory logic multiplexer 180. Multiplexer 180 is of the type which provides at its output the inverted logic state of respective ones of its inputs 0–7 on its right-hand side in response to signals present at its select inputs A, B and C during such times as a high logic state is present at its ENABLE input. Select inputs A, B and C combine to form a binary number where A corresponds to the $2^0$ bit, B corresponds to the $2^1$ bit and C corresponds to the $2^2$ bit. For example, if select inputs B and C are both in the high logic state, the inverted logic state at input 6 will be present at the output terminal during a high WRITE CLOCK signal. During the encode mode of operation, select inputs A, B and C are all in a low logic state thereby selecting the output state of encode multiplexer 121 to control the memory write function.

An eight-bit (256 state) encode counter 160 counts the number of times that each PWM data source 120 has been selected during each encode mode period. Encode counter 160 is denominated as such because it operates only while the system is in the encode mode to generate the PCM number. This number is advantageously stored in an address location associated with the selected PWM data source in a first of the four memory areas in RAM 140 in response to the output state of the data source as seen at write enable input 142 of the RAM. The first memory area 140A shall hereinafter be referred to as the gross current value memory area, and contains address locations for each PWM data source. In this embodiment of the invention, PWM data is provided by the PWM data sources 120 in time frames called sample periods. The output of each PWM source changes from a first to a second logic state during each sample period at a point in time corresponding to the information contained in the PWM output signal. The address counter 100 and the encode counter 160 are synchronized with the sample periods by circuitry which is not shown, so that each of the 256 PWM sources is sampled by multiplexer 121 256 times within a sample period. However, as will be described, address counter 100 contains circuitry for counting 272 clock signals before it issues an overflow signal. A sample period is defined as the period of time required for encode counter 160 to cycle from its first state to its final, 256th state. There are, therefore, 256 times 272 (i.e., 69,632) clock rate time slots in a sample period. During the encode mode, the encode counter is continually enabled and, therefore, operates at the system clock rate. The system clock is not shown in the drawing, however, it provides timing signals at various terminals throughout the system identified by the word "CLOCK". In one embodiment of the invention, the system clock provides timing signals at the rate of approximately 18 MHz.

The PCM sample number in the encode counter is written into the memory location in the first memory area associated with the PWM data source each time that the PWM data source is selected while its output is in the first logic state. During subsequent time slots that the PWM data source is selected and in the second logic state, the write operation is inhibited. Thus, at the end of a sample period, the address location contains the PCM sample number generated by the encode counter immediately before the associated PWM data source changed from the first to the second logic state. This number is called the gross current value and corresponds to the time within a sample period during which the output signal of the associated PWM source was in the first logic state. PCM sample numbers are supplied to RAM 140 via a multiconductor cable 151, a data multiplexer, 150, and a multiconductor cable 141. At the end of a sample period when the output state of each PWM data source has been sampled 256 times, encode counter 160 is in its final state and issues a high overflow signal via a conductor 161 and a multiplexer 167 to a mode counter 164. Mode counter 164 is driven by the system clock after being enabled by multiplexer 167 which selects an enabling signal from either encode counter 160 or address counter 100 depending on whether the system is in the encode mode or the calculate mode of operation. The mode counter provides at its outputs 165 a-d binary states representing the number of times in binary form that the system has changed between the operating modes. Output 165a is the least significant bit and output 165d is the most significant. The individual output bits contain binary states of different rates and durations which are used throughout the system for effecting the operating mode changes, as will be described. During the encode mode of operation the high overflow signal from the encode counter enables mode counter 164 to increment by one and causes the output signal of its least significant bit (LSB) at output 165a to go high. A high signal at output 165a causes the encoder system to switch from the encode mode to the calculation mode.

During the calculation mode, the high signal at the LSB output 165a of mode counter 164 enables a nine-step counter 173 which drives a read only memory (ROM) 170. The same high signal also causes a multiplexer 175 to switch so that address counter 100 is enabled by the delayed overflow signal from step counter 173 at the Q output of a flip-flop 174 rather than the constant high logic state at a terminal 177. Multiplexer 167 is switched so that the mode counter is enabled by the overflow signal from address counter 100 at conductors 105 and 162 rather than the overflow signal from encode counter 160 at lead 161. Encode counter 160 is held in the cleared (zero) state for the duration of the calculation mode by the high logic signal at output 165a of mode counter 164; which signal is inverted by a logic inverter 163 and delivered to the clear input of the encode counter.

ROM 170 is a commercially available device which is advantageously connected at different ones of its control function outputs 171 to terminals which are identified by the symbols ROM in arithmetic circuitry 200, write memory logic multiplexer 180, a multiplexer 182 and an address multiplexer 130. Step counter 173 drives ROM 170 via outputs 172, and also increments address counter 100 with an overflow signal which is conducted to the address counter via flip-flop 174 and multiplexer 175. Persons skilled in the art can program the ROM to control the calculations which are to be performed in accordance with the following teaching on the PCM data from each of the PWM data sources 120. The calculation steps will be described in detail below.

In this embodiment of the invention, step counter 173 is a 16-state counter converted to a 9-state counter which issues an overflow signal and sets to "7" during its final state by operation of a feedback inverter, 179. The overflow signal steps address counter 100 after each sequence of nine calculation steps thereby causing the calculations to be performed sequentially on the data in the memory locations in RAM 140 associated with respective PWM data sources. In brief, nine calculation steps are performed on the PCM data in the memory locations designated by address counter 100 and ROM 170; the step counter subsequently overflows thereby causing the address counter to increment by one so as to select a new set of memory locations; and the calculations are repeated. This procedure continues to cycle until address counter 100 overflows upon entering its final state. The overflow signal from address counter 100 is delivered to mode counter 164 via conductor 105 and multiplexer 167. This signal steps the mode counter, thereby causing the logic state on output 165a to return to zero and the logic state on output 165b to go high. The high logic state on output 165b disables the system, as will be described below.

Briefly, the calculations performed on the PCM data stored in RAM 140 proceed as follows during the calculation mode for each PWM data source: The gross current PCM encoded value stored in the first memory area (140A) is retrieved, and the associated bias value in the second memory area (140B) is subtracted therefrom yielding what is termed an adjusted current value. The absolute difference between the adjusted current value and an adjusted prior value stored in the third memory area (140C) is compared to a corresponding threshold value in the fourth memory area (140D). If the absolute difference between the adjusted current value and the adjusted prior value is greater than the threshold value, the adjusted current value is permitted to output to the computer, and is also stored in the memory location in the third memory area formerly occupied by the adjusted prior value. Thus, there is contained in the third memory area a new adjusted prior value to which subsequent PCM data will be compared. If the absolute difference is less than the threshold value, the adjusted current value is not permitted to output and the associated memory location in the fourth memory area retains the adjusted prior value. Under this arrangement, only such current data which differs from prior data by at least the threshold value is permitted to output.

For purposes of the following detailed description of the operation of the PCM encoder and data throttle it will be assumed that RAM 140 has been loaded with bias and threshold values, and the system has just entered the encode mode of operation. At this time, all of the signals on the conductors in output cables 107 and 108 from 4-bit counters 101 and 103 in address counter 100 are in the zero state. Encode multiplexer 121 provides at its output 122 the inverted binary state of the output signal of the PWM data source 120 connected at its zero input. Encode counter 160 is in the zero state as it had been so held during the calculation mode by operation of mode counter 164 and logic inverter 163, described above. Select inputs A, B and C to write memory multiplexer 130 are all zero, therefore, the output state of encode multiplexer 121 is conducted through multiplexer 180 to RAM 140. If the selected PWM data source 120 is in a low logic state (zero), the low signal on conductor 142 enables RAM 140 to accept the number in encode counter 160, via data multiplexer 150 and cable 141. The number is stored in the memory location which corresponds to the signals transmitted from address counter 100 and the ROM signals at terminals 134 at the O input to the address multiplexer. Address counter 100, specifically counter 101, is enabled by the high logic state at input terminal 177 of multiplexer 175. Thus, the address counter is repeatedly incremented with each clock signal during the encode mode of operation.

The address counter contains two 4-bit counters 101 and 103, and a D-type flip-flop 102 which operates to cause counter 101 to count two successive zero states. Counter 101 is of the type which is cleared by a low state signal at its CLR input terminal. On the sixteenth clock signal after entering the encode mode, counter 101 is in its final state and issues an overflow signal to the D input of the flip-flop. On the seventeenth clock signal, the four outputs in cable 107 roll-over to zero, and the Q output of flip-flop 102 goes low, thereby disabling AND gate 109. On the eighteenth clock signal, the low signal on the output of disabled AND gate 109 clears counter 101. In this manner, counter 101 enters two successive zero states; once as a result of normal roll-over and again by operation of flip-flop 102 and AND gate 109.

The high state signal from the Q output of flip-flop 102 is conducted via OR gate 104 and conductor 106 to the O output to multiplexer 181 and is conducted therethrough to the select input at address multiplexer 130, the B select input to write memory logic multiplexer 180 and the A select input to data multiplexer 150.

These multiplexers switch over in response to the overflow signal from the Q output of flip-flop 102 so as to provide access to RAM 140 by the external computer. In order to provide total memory access to the computer, the computer is connected to the RAM 140 at its three inputs and its output as follows: Computer generated address information 132 is provided to the address input to RAM 140 via cable input 1 of address multiplexer 130 and cable 133. Computer generated data is provided to the data input to RAM 140 via cable input 1 of data multiplexer 150 and cable 141. The computer can control the write function at the write enable input to the RAM 140 via gate 184 connected to inputs 2 and 6 to write memory multiplexer 180 and cable 142. Data from RAM 140 is provided to the computer at data output terminal 144. Additionally, the overflow signal at the Q output of flip-flop 102 enables counter 103 in address counter 100 every 17 clock signals during the encode mode of operation. The counter, therefore, counts 272 (i.e., 17 times 16) clock signals before counter 103 issues an overflow signal on conductor 105.

The high overflow signal from address counter 100 at conductor 105 enables 8-bit encode counter 160 to increment by one on the following clock signal. The encode counter, therefore, counts the number of times within a sample period that address counter 100 and encode multiplexer 121 have cycled to sample each PWM data source. After the 256th such cycle, encode counter 160 is in its final state and generates a high overflow signal at output 161. This signal is conducted through output 168 of multiplexer 167 to mode counter 164 which is consequently enabled and switches the encoder system to the calculation mode as described above. Having completed a sample period, the RAM contains in its first memory area (GROSS CURRENT 140A) the gross PCM values of each PCM data source during the sample period. These values correspond to the signals generated by encode counter 160 immediately preceding each PWM data source's change of state.

With the system now in the calculation mode of operation, step counter 173 is enabled by the high signal from the mode counter at output 165a. The step counter drives ROM 170 and address counter 100 to perform the following sequence of nine function steps on the data in the RAM associated with each of the 256 PWM data sources:

| CLOCK SIGNAL NUMBER | ALU INPUT A FROM LATCH A (210) | ALU INPUT B FROM LATCH B (230) | ALU 220 FUNCTION | LATCH C (250) |
|---|---|---|---|---|
| 1. | X | X | CLEAR | X |
| 2. | GROSS CURRENT | 0 | A+B | X |
| 3. | BIAS | GROSS CURRENT | B−A | X |
| 4. | X | ADJUSTED CURRENT (GROSS CURRENT-BIAS) | CLEAR | X |
| 5. | X | 0 if ADJUSTED CURRENT is < 0 | CLEAR | X |
| 6. | ADJUSTED PRIOR | ADJUSTED CURRENT or 0 | A−B | ADJUSTED CURRENT |
| 7. | −1 | VALUE CHANGE | A−B | ADJUSTED CURRENT |
| 8. | THRESHOLD | ABSOLUTE VALUE CHANGE | A−B | ADJUSTED CURRENT |

| CLOCK SIGNAL NUMBER | ALU INPUT A FROM LATCH A (210) | ALU INPUT B FROM LATCH B (230) | ALU 220 FUNCTION | LATCH C (250) |
|---|---|---|---|---|
| 9. | OPTIONALLY WRITE ADJUSTED CURRENT VALUE IN PLACE OF ADJUSTED PRIOR VALUE IN THE MEMORY IF THE ABSOLUTE VALUE CHANGE EXCEEDS THE THRESHOLD VALUE, AND GRANT MEMORY ACCESS TO COMPUTER ON NEXT CLOCK SIGNAL. | | | |

X = Don't care value

As indicated in the above table of function steps, arithmetic logic unit (ALU) 220 is cleared on the first clock signal after entering the calculation mode; also, although not noted on the table, address counter 100 has stepped so as to return to all zero first state. ROM control signals at terminals 134 of address multiplexer 130 and the address signals at cable 131 coact to select the zero memory location in the first memory area (GROSS CURRENT) of the RAM. The gross PCM value of the signal from the PWM data source 120 connected at the zero input to encode multiplexer 121 is selected for output from the RAM at its multiconductor output 143.

On the second clock signal, the gross current value is entered into and is present at the output of latch A (210), the ALU is switched into the A+B mode by ROM control, and latch B is initialized by being clocked by ROM control so as to enter the all zero output from the ALU which resulted from the clear opeation of the first clock signal. ROM controls 134 at address multiplexer 130 select the data stored in the zero memory location in the second memory area (BIAS 140B) of the RAM for output. On the third clock signal, the gross current value to which zero has been added by the ALU on the second clock signal is entered into latch B (230) by ROM control at AND gate 243, the bias value is entered into latch A and the ALU is switched into the B−A mode.

On the fourth clock signal of the calculation mode the adjusted current value (i.e., gross current value - bias) which was calculated after the third clock signal is entered into latch B, and the ALU is placed in the clear mode. The adjusted current value represents the net PCM value, which may equal zero. However, minor encoding errors may cause the adjusted current value to be a small negative number when it should be zero. If such an error exists, the most significant bit (MSB) of the ALU on a conductor of cable 221 will be high and is conducted via lead 222 to an input terminal of AND gate 242 in logic circuit 240. On the fifth clock signal, the ROM input to AND gate 242 goes high, and if the MSB signal on lead 222 is high, signifying that the value of the adjusted current value is negative, AND gate 242 is enabled and latch B will be clocked so as to enter the zero value from the ALU which is in the clear mode on this clock signal. This conditional clocking action corrects the encoding error by setting negative adjusted current values to zero. Additionally, on the fifth clock signal, ROM controls 134 at address multiplexer 130 select the data stored in the zero memory location in the third memory area (ADJUSTED PRIOR 140C) for output.

On the sixth clock signal, the adjusted prior value is entered into latch A from the RAM, the adjusted current value is entered into latch C (250), and the ALU is switched into the A−B mode. Latch B retains the adjusted current value. It should be noted that latch A is a tristate device (e.g., Texas Instruments, Inc. 745374) which, by ROM control, is advantageously switched into a high output impedance mode on the 6th clock signal. While in the high impedance mode, resistors 212 which are each connected at one end to respective conductors of cable 213 at input A of the ALU, and are all connected at the other end to a high logic state at terminal 211, raise all of the conductors in cable 213 to a high logic level. On the 7th clock signal, the A input to the ALU is all ones, the value change computed after the 6th clock signal is entered into latch B, address ROM controls 134 select the fourth memory area (THRESHOLD) and the ROM input to AND gate 242 in logic circuit 240 is high. If the value change in latch B is negative, latch B is clocked via AND gate 242 and OR gate 241 on the 7th clock signal so as to enter the absolute positive value change.

On the 8th clock signal the threshold value is entered into latch A, and ROM controls at select input A of multiplexer 180 and the zero input to multiplexer 182 go high. This action causes multiplexer 180 to select the ALU sign bit signal at multiplex input 5 to be delivered to write enable input 142 of the RAM, and data multiplexer 150 to select the output of latch C (adjusted current value) via conductors 153 at its input 2 to be delivered to data input 141 of the RAM. ROM controls 134 at address multiplexer 130 select the third memory area (ADJUSTED PRIOR). If the MSB from the ALU on conductor 222 is high (i.e., negative value), then the absolute value change is greater than the threshold value and the RAM is enabled to receive the adjusted current value to be written over the associated prior adjusted value; otherwise, the adjusted current value is not stored in the RAM. If the adjusted current value is entered into the RAM, it is also entered into FIFO 190 for output to the computer along with the address information from address counter 100 via cable 123. The adjusted current value is entered in the FIFO which is enabled by monostable multivibrator 260. The multivibrator receives a ROM controlled enabling signal on the ninth clock signal after entering the calculation mode of operation, and, if the ALU sign bit is high, the multivibrator sets and is designed to remain set for a sufficient length of time to enable the FIFO to receive the adjusted current value without allowing interference from the next sequential outputs of address counter 100 and the latch C 250. Additionally on the ninth clock signal, step counter 173 overflows via flip-flop 174 and on the following clock signal, the step counter will go to "7", as described above. The overflow signal causes select input B of write memory logic multiplexer 180 to go high while ROM controlled select input A is low, thereby granting computer acess to the RAM by the above-described operation of data input multiplexer 150, address input multiplexer 130, AND gate 184 and write memory multiplexer 180. Since the overflow signal to multiplexer 181 is delayed by one clock signal by operation of flip-flop 174, computer access to the RAM occurs on the first clock signal of each calculation cycle. Thus, computer access to the RAM is granted when the ALU is in the clear mode. The overflow signal enables address counter 100 to increment by one, and the above function steps are repeated on the data in the RAM corresponding to the PWM data source 120 connected to the 1 input to encode multiplexer 121. This procedure is continued until address counter 100 overflows upon selecting the 256th PWM source connected to the 255th input to encode multiplexer 121. The overflow signal is conducted to mode counter 164 via multiplexer 167, consequently causing the signal on output 165a of the mode counter to go low.

It should be noted that address counter 100 counts a double zero during the calculation mode, as it does during the encode mode of operation. Accordingly, sixteen of the PCM samples are processed twice. Such redundancy is of small consequence because the second processing produces no result. When the new value exactly equals the old value, there is no threshold value which will cause a FIFO entry.

In this embodiment of the invention, there are essentially two techniques which are employed to effect a PCM output data rate reduction. The first technique is the hereinabove discussed computer adjustment of the threshold values in the fourth area of memory. Increasing the threshold values stored in the RAM yields decreased encoder sensitivity with the result that a higher significance requirement is imposed on the output data. Alternatively, the output data reduction is effected without the need to alter the threshold values by application of the second technique. The second technique simply permits the external computer to control the clear function of mode counter 164 via commands which are illustrated in the figure by function block 169. When the output signal of mode counter 164 at output lead 165b goes high, AND gate 109 in address counter 100 disables four-bit counter 101 by delivering thereto a continuous clear signal. Such a clear signal at the address counter effectively disables the system, preventing operation in either the encode or calculation modes. The disability continues until the mode counter is cleared by a command from the external computer (169) so as to cause the signal on output lead 165b of mode counter 164 to return to the zero state. This operation permits the computer to reduce the output rate of the PCM data on command. Also, the output of OR gate 104 at conductor 106 is high thereby granting continuous memory access to the computer, as described above, during the disability.

The system can be adjusted to operate in several successively repeating cycles of encode and calculate modes by disconnecting the lead connected at output 165b of mode counter 164 and connecting it to either output 165c or 165d. For example, if the lead is connected to output 165c, the system will cycle through the operating modes as follows: encode-calculate-encode-calculate-disable. Such operation reduces by a factor of 2 the need for encode commands 169 from the computer. Alternatively, if the lead is connected to a constant low logic state, e.g., ground, then the system will operate continuously in alternating encode and calculate modes.

Although the invention is disclosed within the context of a specific embodiment, it will be understood that persons skilled in the art can make various modifications without departing from the spirit or scope of the invention.

What is claimed is:

1. An arrangement for converting a pulse width modulated (PWM) signal to a pulse code modulated (PCM) signal, the arrangement comprising:
    an input terminal capable of receiving a PWM signal;
    an output terminal capable of connection to an external device for utilizing the generated PCM signal; and
    converting means connected between the input and output terminals comprising;
    an encoding means capable of generating a digital signal in response to the PWM signal at the input terminal which digital signal is a PCM representation of the portion of the time within a sample period during which the PWM signal is in a first logic state;
    first storage means capable of storing a digital signal generated by said encoding means for a prior sample period;
    first comparison means capable of generating a digital output signal at the end of each sample period which is representative of the difference between the digital signal generated by said encoding means and the digital signal stored in said first storage means;
    second storage means capable of storing a digital signal corresponding to a predetermined data threshold value representative of a significant value change; and
    second comparison means capable of both comparing the digital output signal from said first comparison means with the predetermined data threshold value in the second storage means, and generating an output signal capable of causing the digital signal generated by said encoding means to be both stored in said first storage means and applied to the output terminal of the arrangement.

2. The arrangement of claim 1 wherein the encoding means comprises
    an encode counter having a predetermined number of states for counting timing signals during the sample period and an output for producing a signal responsive to the number of timing signals counted while the PWM signal is in the first logic state during said sample period, and
    a memory for storing the value of the output signal of the encode counter.

3. The arrangement of claim 2 wherein said converting means further comprises
    third storage means for storing a PCM value corresponding to a PWM zero value, and
    means for adjusting a current PCM value generated by said encoding means, which adjusted PCM value represents the difference in value between the current PCM value generated by said encoding means and the value stored in said third storage means.

4. The arrangement of claim 2 wherein there is provided an additional n-1 input terminals each capable of receiving a separate PWM signal and the converting means further comprising
    address counting means capable of assuming n numbers of states for counting timing signals and outputting first signals responsive to the number of timing signals counted, which first signals identify corresponding ones of the n input terminals of the arrangement and a second signal when a predetermined one of the states is reached, and multiplexing means comprising n first inputs connected to respective ones of the n input terminals of the arrangement for receiving PWM data, second inputs for receiving the first signals from the address counting means and an output for providing a logic state responsive to a logic state at the input terminal connected at a respective one of the first inputs selected in response to the signals at the second inputs.

5. The arrangement of claim 4 wherein the memory and selectable ones of the first, second and third storage means each have alternatively selectable data input means, alternatively selectable address input means, and alternatively selectable enabling input means, the address counting means includes means for generating third output signals during preselected states, and said converting means further comprises switching means responsive to the third output signal of the address counting means for selecting one of each of the alternatively selectable data, address and enabling input means.

6. The arrangement of claim 5 wherein the switching means comprises a first multiplexer for providing computer access to an address data input to selectable ones of the memory and the first, second and third storage means in response to the third output signal of the address counting means, a second multiplexer for providing computer access to a data input to selectable ones of the memory and the first, second and third storage means in response to the third output signal of the address counting means, and a third multiplexer for providing computer access to an enabling input to selectable ones of the memory and the first, second and third storage means in response to the third output signal of the address counting means.

7. The arrangement of claim 1 wherein the first and second comparison means each comprise a processor for performing arithmetic processing steps using the data in the first and second storage means.

8. The arrangement of claim 7 wherein the processor for performing arithmetic processing steps comprises control means responsive to preselected ones of the timing signals for generating control signals, means having first and second data inputs and a data output for selectively generating signals corresponding to the sum and difference, respectively, of signals at the first and second data inputs, which selectively generated signals are provided at the data output in response to the control signals from the control means, a first register for receiving and holding data from the first and second storage means and delivering the data to the first data input of the selective signal generating means in response to signals from the control means, a second register for receiving data from the data output of the selective signal generating means in response to signals from the control means and delivering the data to the second data input of the selective signal generating means, and a third register for receiving data from the second register in response to signals from the control means and delivering the data to the first storage means and to the output terminal in response to signals from the data output of the selective signal generating means and the control means.

9. The arrangement of claim 8 wherein the control means comprises a calculation counter having a predetermined number of states for counting timing signals and outputting first signals responsive to the number of timing signals counted, and a second signal when the counter is in its final state, and a read-only memory having plural outputs connected to the selective signal generating means and the first and second storage means, which outputs provide logic states responsive to the first output signals of the calculation counter.

* * * * *